(12) United States Patent
Liu et al.

(10) Patent No.: US 8,773,094 B2
(45) Date of Patent: Jul. 8, 2014

(54) ALTERNATING CURRENT LINE EMULATOR

(75) Inventors: Yung-Hsiang Liu, New Taipei (TW); Kuo-Hsin Chu, New Taipei (TW); Hsu-Chin Wu, New Taipei (TW); Hwai-Ching Shi, New Taipei (TW); Wei-Kang Liang, New Taipei (TW)

(73) Assignee: Motech Industries Inc., Shenkeng Dist., New Taipei (TW)

( * ) Notice: Subject to any disclaimer, the term of this patent is extended or adjusted under 35 U.S.C. 154(b) by 253 days.

(21) Appl. No.: 13/326,274

(22) Filed: Dec. 14, 2011

(65) Prior Publication Data
US 2013/0063993 A1    Mar. 14, 2013

(30) Foreign Application Priority Data

Sep. 13, 2011    (TW) .............................. 100132848 A

(51) Int. Cl.
*H02J 3/14*     (2006.01)
*G05F 1/00*     (2006.01)
*H02H 3/08*     (2006.01)
*H02H 9/02*     (2006.01)
*H02M 1/00*     (2006.01)

(52) U.S. Cl.
USPC ............ 323/272; 307/38; 323/283; 361/93.2; 363/78

(58) Field of Classification Search
USPC ........ 307/36–39, 51; 323/241, 271, 272, 277, 323/283; 324/416, 522, 523, 537, 750.01, 324/750.02, 764.01; 361/93.1, 93.2; 363/76, 78, 79, 124
See application file for complete search history.

(56) References Cited

U.S. PATENT DOCUMENTS

| | | | |
|---|---|---|---|
| 6,239,511 B1 * | 5/2001 | Joho | 307/38 |
| 6,949,843 B2 | 9/2005 | Dubovsky | |
| 2010/0236612 A1 * | 9/2010 | Khajehoddin et al. | 136/252 |

FOREIGN PATENT DOCUMENTS

TW    200507401    2/2005

* cited by examiner

*Primary Examiner* — Adolf Berhane
*Assistant Examiner* — Gary Nash
(74) *Attorney, Agent, or Firm* — Winston Hsu; Scott Margo

(57) ABSTRACT

An alternating current (AC) line emulator includes an AC power supply and an automatic regulating load. The AC power supply is used for providing an AC line frequency and an AC line voltage. The automatic regulating load is coupled between the AC power supply and a grid-connected power generation system for functioning as a test load of the grid-connected power generation system, and preventing current from reversing to the AC power supply and shutting down the AC power supply. When the grid-connected power system is tested, power consumption of the automatic regulating load is equal to a sum of output power of the grid-connected power generation system and output power of the AC power supply.

7 Claims, 1 Drawing Sheet

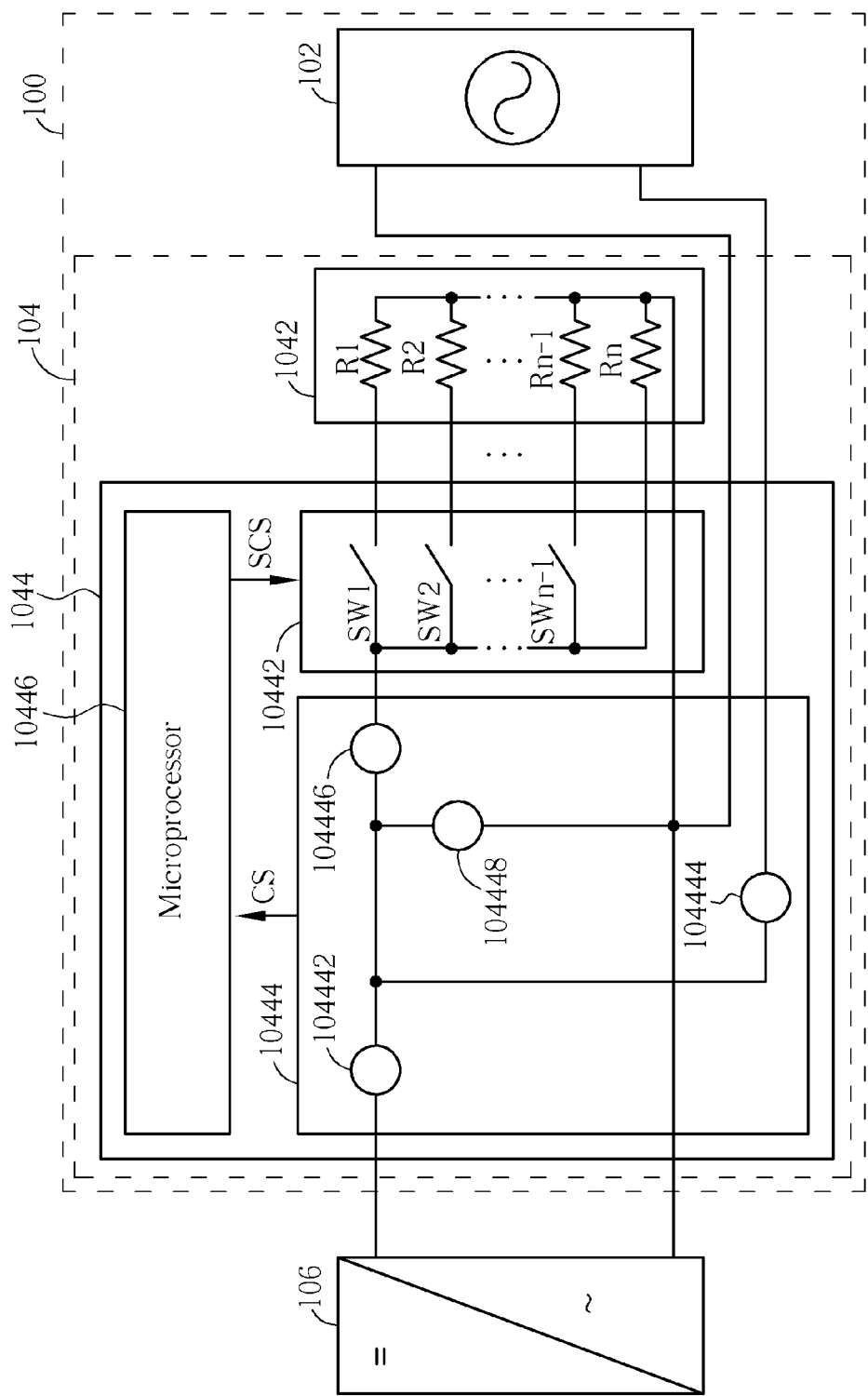

ALTERNATING CURRENT LINE EMULATOR

BACKGROUND OF THE INVENTION

1. Field of the Invention

The present invention is related to an alternating current (AC) line emulator, and particularly to an AC line emulator that utilizes an automatic regulating load so that power consumption of the automatic regulating load is equal to a sum of output power of a grid-connected power generation system and output power of an AC power supply. It could prevent current from reversing to the AC power supply with the result that the AC power supply being shut down.

2. Description of the Prior Art

Generally speaking, in the field of renewable energy, the popularity of a grid-connected power generation system grows up because of its better economic benefits and less detrimental impact on the environment. A grid-connected power generation system is used for converting direct current (DC) power generated by itself into alternating current (AC) power for a utility grid through a DC/AC inverter. Before a manufacturer prepares to design a grid-connected power generation system, the manufacturer must perform a series of standard tests on the designed grid-connected power generation system to determine whether requirements of safety certifications are met. However, total voltage harmonic distortion of a utility grid may affect harmonic current of a grid-connected power generation system. In addition, when the AC power is injected into a utility grid from a grid-connected power generation system, the manufacturer must consider conditions of the utility grid and the influences on the grid-connected power generation system caused by the loads coupled to the utility grid.

In the prior art, diagnostic programs are used to test a grid-connected power generation system through a power resistor chamber and an AC power supply. However, to successfully perform the diagnostic programs on the grid-connected power generation system, a user must frequently control switches coupled to the power resistor chamber and carefully regulate output power of the AC power supply to ensure that the grid-connected power generation system operates under the desired conditions. For the user, the above mentioned testing process is tedious and likely to cause errors. Therefore, the prior art is not a good choice for testing the grid-connected power generation system.

SUMMARY OF THE INVENTION

An embodiment provides an alternating current (AC) line emulator. The AC line emulator includes an AC power supply and an automatic regulating load. The AC power supply is used for providing an AC line frequency and an AC line voltage. The automatic regulating load is coupled between the AC power supply and a grid-connected power generation system for functioning as a test load of the grid-connected power generation system, and preventing current from reversing to the AC power supply and shutting down the AC power supply. Power consumption of the automatic regulating load is equal to a sum of output power of the grid-connected power generation system and output power of the AC power supply when the grid-connected power generation system is tested.

The present invention provides an AC line emulator which utilizes an automatic regulating load to function as a test load of a grid-connected power generation system, and utilizes an AC power supply to provide an AC line frequency and an AC line voltage for simulating various conditions of an AC line. In addition, the automatic regulating load can regulate an equivalent resistance of a power resistor chamber to keep output power of the AC power supply above a predetermined value according to current and voltages of the grid-connected power generation system. As a result, the AC power supply for power consumption of the automatic regulating load could be equal to a sum of output power of the grid-connected power generation system and the output power of the AC power supply. It also prevents current from reversing to the AC power supply and shutting down the AC power supply. Therefore, compared to the prior art, the present invention can improve disadvantages of tediousness and likelihood of mistakes occurring during testing the grid-connected power generation system.

These and other objectives of the present invention will become obvious to those of ordinary skill in the art after reading the following detailed description of the preferred embodiment that is illustrated in the various figures and drawings.

BRIEF DESCRIPTION OF THE DRAWINGS

FIGURE is a diagram illustrating an alternating current line emulator according to an embodiment.

DETAILED DESCRIPTION

Please refer to FIGURE. FIGURE is a diagram illustrating an alternating current (AC) line emulator 100 according to an embodiment. The AC line emulator 100 includes an AC power supply 102 and an automatic regulating load 104. The AC power supply 102 can be a programmable AC power supply for providing an AC line frequency (such as 60 Hz) and an AC line voltage (such as 110V) to simulate various conditions of an AC line, and isolate noise, harmonics, and ripples fed through from the AC line. The automatic regulating load 104 is coupled between the AC power supply 102 and a grid-connected power generation system 106 for functioning as a test load of the grid-connected power generation system 106. The automatic regulating load 104 could prevent current from reversing to the AC power supply 102 and shutting down the AC power supply 102. When the grid-connected power generation system 106 is tested, power consumption of the automatic regulating load 104 is equal to a sum of output power of the grid-connected power generation system 106 and output power of the AC power supply 102. The grid-connected power generation system 106 can be a photovoltaic generator. In addition, the grid-connected power generation system 106 transmits output power of the grid-connected power generation system 106 to the AC line according to the AC line frequency and the AC line voltage.

As shown in FIGURE, the automatic regulating load 104 includes a power resistor chamber 1042 and a load controller 1044. The power resistor chamber 1042 includes a plurality of parallel resistors R1 to Rn, where n is an integer larger than 1. The power resistor chamber 1042 is coupled between an output terminal of the grid-connected power generation system 106 and an output terminal of the AC power supply 102 for consuming output power of the grid-connected power generation system 106 and output power of the AC power supply 102. The load controller 1044 is coupled between the power resistor chamber 1042 and the grid-connected power generation system 106 for automatically regulating an equivalent resistance of the power resistor chamber 1042 to make the power consumption of the automatic regulating load 104 equal to the sum of the output power of the grid-connected power generation system 106 and the output power of the AC power supply 102 when the grid-connected power generation system 106 is tested. The output power of the grid-connected power generation system 106 is larger than the output power of the AC power supply 102. That is to say, the majority of the power consumption of the automatic regulating load 104 is supplied by the grid-connected power generation system 106, and the minority of the power consumption of the automatic regulating load 104 is supplied by the AC power supply 102. In addition, a user can also set the automatic regulating load 104 to a fixed load mode according to practical requirements of the grid-connected power generation system 106. When the automatic regulating load 104 is in the fixed load mode, the equivalent resistance of the power resistor chamber 1042 is a fixed value, and the function of the load controller 1044 for automatically regulating the equivalent resistance of the power resistor chamber 1042 is disabled. Further, when the automatic regulating load 104 is powered on, the automatic regulating load 104 can change the equivalent resistance of the power resistor chamber 1042 one by one to check whether the load controller 1044 fails.

As shown in FIGURE, the load controller 1044 includes a switch circuit 10442, a sensor circuit 10444, and a microprocessor 10446. The switch circuit 10442 is coupled to the power resistor chamber 1042, and the switch circuit 10442 includes a plurality of parallel switches SW1 to SWn-1, where each parallel switch is in series connected with a corresponding one of the plurality of parallel resistors R1 to Rn-1 included in the power resistor chamber 1042. The plurality of parallel switches SW1 to SWn-1 are bidirectional power switches. The sensor circuit 10444 includes a first current sensor 104442, a second current sensor 104444, a third current sensor 104446, and a voltage feedback circuit 104448. The first current sensor 104442 is coupled to the grid-connected power generation system 106 for sensing output current of the grid-connected power generation system 106; the second current sensor 104444 is coupled to the AC power supply 102 for sensing output current of the AC power supply 102; the third current sensor 104446 is coupled to the switch circuit 10442 for sensing input current of the switch circuit 10442; the voltage feedback circuit 104448 is coupled to the switch circuit 10442 for sensing an output voltage of the grid-connected power generation system 106. The first current sensor 104442, the second current sensor 104444, the third current sensor 104446, and the voltage feedback circuit 104448 are used for converting the output current of the grid-connected power generation system 106, the output current of the AC power supply 102, the input current of the switch circuit 10442, and the output voltage of the grid-connected power generation system 106 into a control signal CS. The microprocessor 10446 is coupled to the switch circuit 10442 and the sensor circuit 10444 for receiving the control signal CS, and generating a switch control signal SCS according to the control signal CS and a lookup table. The microprocessor 10446 can display operation information of the automatic regulating load 104 on a personal computer or liquid crystal display for the user. In addition, the automatic regulating load 104 further provides a hysteresis function to prevent the microprocessor 10446 from continuously adjusting turning-on and turning-off of the plurality of bidirectional parallel switches SW1 to SWn-1 of the switch circuit 10442 according to the control signal CS and the lookup table. In addition, the operation frequency of the microprocessor 10446 is much higher than that provided by the AC power supply 102.

The switch circuit 10442 utilizes the switch control signal SCS to control turning-on and turning-off of the plurality of bidirectional parallel switches SW1 to SWn-1 included in the switch circuit 10442 to regulate the equivalent resistance of the plurality of parallel resistors R1 to Rn included in the power resistor chamber 1042. Therefore, the power consumption of the power resistor chamber 1042 can be determined according to equation (1):

$$P = \frac{V^2}{R} \quad (1)$$

As shown in equation (1), P is the power consumption of the power resistor chamber 1042, R is the equivalent resistance of the plurality of parallel resistors R1 to Rn of the power resistor chamber 1042, and V is the output voltage of the grid-connected power generation system 106.

In addition, the parallel resistor Rn, which is one of the parallel resistors R1 to Rn included in the power resistor chamber 1042, is not in series connected with any one of the parallel switches SW1 to SWn-1 included in the switch circuit 10442. That is to say, the parallel resistor Rn is coupled to an output terminal of the AC power supply 102 directly without through any of the plurality of parallel switches SW1 to SWn-1 included the switch circuit 10442. It ensures that the AC power supply 102 can provide fundamental output power to prevent current from reversing to the AC power supply 102.

In addition, when the grid-connected power generation system 106 is tested, detailed relationships among the power consumption of the automatic regulating load 104, the output power of the grid-connected power generation system 106, and the output power of the AC power supply 102 are as follows. First, when the grid-connected power generation system 106 is powered off, the AC power supply 102 can provide the fundamental output power to match the minimum equivalent resistance of the power resistor chamber 1042. At this time, the power consumption of the automatic regulating load 104 is equal to the output power of the AC power supply 102. Then, if the output power of the grid-connected power generation system 106 is greater than zero, the load controller 1044 can automatically regulate the equivalent resistance of the power resistor chamber 1042 according to the output current and the output voltage of the grid-connected power generation system 106, and the output current of the AC power supply 102. In this way, a minimum difference between the power consumption of the automatic regulating load 104 and the output power of the grid-connected power generation system 106 could be achieved. That is to say, the majority of the power consumption of the automatic regulating load 104 is supplied by the grid-connected power generation system 106 and the minority of the power consumption of the automatic regulating load 104 is supplied by the AC power supply 102. Therefore, if variation of the output power of the grid-connected power generation system 106 is too severe, the AC power supply 102 still has a sufficient margin to make the automatic regulating load 104 have enough response time to regulate the equivalent resistance of the power resistor chamber 1042 for preventing current from reversing to the AC power supply 102 and shutting down the AC power supply 102, and ensuring the output power of the AC power supply 102 does not exceed maximum output power of the AC power supply 102.

An erasable programmable read only memory (EPROM) is built in the microprocessor 10446, so that the setting previously stored in the microprocessor 10446 will be kept when the AC line emulator 100 is turned off and the next operation of the automatic regulating load 104 will not be affected when being powered on again. In addition, the present invention is not limited to the structure of the load controller 1044 in FIGURE. Any configuration in which the power consumption of the automatic regulating load 104 is equal to the sum of the output power of the grid-connected power generation system 106 and the output power of the AC power supply 102 falls within the scope of the present invention.

To sum up, the AC line emulator utilizes the automatic regulating load as a test load of the grid-connected power generation system, and utilizes the AC power supply to provide the AC line frequency and the AC line voltage for various simulation conditions of the AC line. In addition, the automatic regulating load can regulate the equivalent resistance of the power resistor chamber and keeps the output power of the AC power supply above a predetermined value according to current and voltages of the grid-connected power generation system. Consequently, the AC power supply for the power consumption of the automatic regulating load is equal to the sum of the output power of the grid-connected power generation system and the output power of the AC power supply. Besides, current is kept from reversing to the AC power supply, and the AC power supply won't be shut down accordingly. Therefore, compared to the prior art, the present invention can improve disadvantages of tediousness and likelihood of mistakes occurring during testing the grid-connected power generation system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An alternating current (AC) line emulator, comprising:
   an AC power supply for providing an AC line frequency and an AC line voltage; and
   an automatic regulating load coupled between the AC power supply and a grid-connected power generation system for functioning as a test load of the grid-connected power generation system, and preventing current from reversing to the AC power supply and shutting down the AC power supply, wherein power consumption of the automatic regulating load is equal to a sum of output power of the grid-connected power generation system and output power of the AC power supply when the grid-connected power generation system is tested, wherein the automatic regulating load comprises:
      a power resistor chamber comprising a plurality of parallel resistors for consuming the output power of the grid-connected power generation system and the output power of the AC power supply; and
      a load controller for automatically regulating an equivalent resistance of the power resistor chamber to make the power consumption of the automatic regulating load be equal to the sum of the output power of the grid-connected power generation system and the output power of the AC power supply when the grid-connected power generation system is tested, wherein the load controller comprises:
         a switch circuit coupled to the power resistor chamber, the switch circuit comprising a plurality of parallel switches, wherein each parallel switch is in series with one parallel resistor of the plurality of parallel resistors;
         a sensor circuit comprising:
            a first current sensor coupled to the grid-connected power generation system for sensing output current of the grid-connected power generation system;
            a second current sensor coupled to the AC power supply for sensing output current of the AC power supply;
            a third current sensor coupled to the switch circuit for sensing input current of the switch circuit; and
            a voltage feedback circuit coupled to the switch circuit for sensing an output voltage of the grid-connected power generation system;
            wherein the first current sensor, the second current sensor, the third current sensor, and the voltage feedback circuit are used for converting the output current of the grid-connected power generation system, the output current of the AC power supply, the input current of the switch circuit, and the output voltage of the grid-connected power generation system into a control signal; and
         a microprocessor coupled to the switch circuit and the sensor circuit for receiving the control signal, and generating a switch control signal to the switch circuit according to the control signal;
         wherein the switch circuit utilizes the switch control signal to control turning-on and turning-off of the plurality of parallel switches for regulating the equivalent resistance of the plurality of parallel resistors of the power resistor chamber.

2. The AC line emulator of claim 1, wherein the AC power supply is used for simulating various conditions of an AC line.

3. The AC line emulator of claim 1, wherein the grid-connected power generation system is a photovoltaic generator.

4. The AC line emulator of claim 1, wherein the plurality of parallel switches are bidirectional power switches.

5. The AC line emulator of claim 1, wherein the microprocessor generates the switch control signal according to the control signal and a lookup table.

6. The AC line emulator of claim 1, wherein one parallel resistor of the plurality of parallel resistors is not in series with any parallel switch of the plurality of parallel switches.

7. The AC line emulator of claim 1, wherein a difference between the power consumption of the automatic regulating load and the output power of the grid-connected power generation system is a minimum value when the power consumption of the automatic regulating load is equal to the sum of the output power of the grid-connected power generation system and the output power of the AC power supply.

* * * * *